US008294267B2

(12) United States Patent
Banin et al.

(10) Patent No.: US 8,294,267 B2
(45) Date of Patent: Oct. 23, 2012

(54) NANOSTRUCTURES AND METHOD FOR SELECTIVE PREPARATION

(75) Inventors: Uri Banin, Mevasseret Zion (IL); Taleb Mokari, Jerusalem (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 561 days.

(21) Appl. No.: 10/588,369

(22) PCT Filed: Feb. 3, 2005

(86) PCT No.: PCT/IL2005/000133
§ 371 (c)(1),
(2), (4) Date: Oct. 16, 2007

(87) PCT Pub. No.: WO2005/075339
PCT Pub. Date: Aug. 18, 2005

(65) Prior Publication Data
US 2008/0128761 A1 Jun. 5, 2008

Related U.S. Application Data

(60) Provisional application No. 60/541,248, filed on Feb. 4, 2004, provisional application No. 60/554,913, filed on Mar. 22, 2004.

(51) Int. Cl.
*H01L 23/48* (2006.01)
*B32B 15/00* (2006.01)
(52) U.S. Cl. . 257/746; 257/734; 257/741; 257/E29.345; 438/497; 977/762

(58) Field of Classification Search .................. 257/288, 257/9, 734, 741, 746, E29.345; 438/497; 977/762
See application file for complete search history.

(56) References Cited

U.S. PATENT DOCUMENTS

| 5,505,928 | A | 4/1996 | Alivisatos et al. |
| 7,225,082 | B1* | 5/2007 | Natan et al. ..................... 702/27 |
| 2002/0175408 | A1* | 11/2002 | Majumdar et al. ............ 257/734 |
| 2003/0010987 | A1 | 1/2003 | Banin et al. |
| 2004/0007964 | A1 | 1/2004 | Chen |

FOREIGN PATENT DOCUMENTS

| WO | 9106036 A1 | 5/1991 |
| WO | 0229140 A1 | 4/2002 |
| WO | 02079514 A1 | 10/2002 |
| WO | 03054953 A1 | 7/2003 |

(Continued)

OTHER PUBLICATIONS

Patel, Ramesh; WIPO 91/06036; Coated Particles and Methods of Coating Particles; 1991; entire document.*

(Continued)

*Primary Examiner* — N Drew Richards
*Assistant Examiner* — John P Dulka
(74) *Attorney, Agent, or Firm* — Browdy and Neimark, PLLC

(57) ABSTRACT

The present invention provides novel nanostructure composed of at least one elongated structure element, an elongated structure element of said nanostructure bearing a different zone made of metal, metal alloy, conductive polymer or semiconductor and selectively grown onto at least one of the end portions of the elongated structure element. The present invention further provides a selective method for forming in a liquid medium, such nanostructures.

28 Claims, 8 Drawing Sheets

FOREIGN PATENT DOCUMENTS

| WO | 03091458 A1 | 11/2003 |
| WO | 03097904 A1 | 11/2003 |
| WO | WO 03091458 A1 * | 11/2003 |
| WO | WO 03097904 A1 * | 11/2003 |

OTHER PUBLICATIONS

Banin, Uri, et al., "Tunnelling and Optical Spectroscopy of Semiconductor Nanocrystals", Annu. Rev. Phys. Chem., 2003, vol. 54, pp. 465-492.

Braun, Erez, etal., "DNA-templated assembly and electrode attachment of a conducting silver wire", Nature, Feb. 19, 1998, vol. 391, pp. 775-778.

Coucouvanis, Dimitri, "The Chemistry of the Dithioacid and 1, 1-Dithiolate Complexes", Progress in Inorganic Chemistry, 1970, vol. 11, Interscience Publishers, New York, pp. 234-235.

Cretier, J.E., et al., "The Crystal Structure of the Beta Form of Gold Selenide, β-AuSe.", Mat. Res. Bull., 1973, vol. 8, pp. 1427-1430.

Cui, Yi, et al., "Functional Nanoscale Electronic Devices Assembled Using Silicon Nanowire Building Blocks", Science, Feb. 2, 2001, vol. 291, pp. 851-853.

Dumestre, F., et al., "Superlattices of Iron Nanocubes Synthesized from Fe[N(SiMe3)2]2", Science, Feb. 6, 2004, vol. 303, pp. 821-823.

Fan, Chunhai, et al., "Beyond superquenching: Hyper-efficient energy transfer from conjugated polymers to gold nanoparticles", PNAS, May 27, 2003, vol. 100, No. 11, pp. 6297-6301.

Goldberger, Joshua, et al., "Single-crystal gallium nitride nanotubes", Nature, Apr. 10, 2003, vol. 422, pp. 599-601.

Gomez, Silvia, et al., "Gold nanoparticles from self-assembled gold(I) amine precursors", Chem. Commun., 2000, pp. 1945-1946.

Gudiksen, Mark S., et al., "Growth of nanowire superlattice structures for nanoscale photonics and electronics", Nature, Feb. 7, 2002, vol. 415, pp. 617-620.

Heinze, S., et al, "Carbon Nanotubes as Schottky Barrier Transistors", Physical Review Letters, Sep. 2, 2002, vol. 89, No. 10, pp. 106801.1-106801.4.

Javey, Ali, et al., "Ballistic carbon nanotube field-effect transistors", Nature, Aug. 7, 2003, vol. 424, pp. 654-657.

Jin, R., et al. "Photoinduced Conversion of Silver Nanospheres to Nanoprisms", Science, Nov. 30, 2001, vol. 294, pp. 1901-1903.

Jones, R.M., et al., "Building highly sensitive dye assemblies for biosensing from molecular building blocks", PNAS, Dec. 18, 2001, vol. 98, No. 26, pp. 14769-14772.

Kan, S., et al., "Synthesis and size-dependent properties of zinc-blende semiconductor quantum rods", Nature Materials, Mar. 2003, vol. 2, pp. 155-158.

Keren, K., et al., "DNA-Templated Carbon Nanotube Field-Effect Transistor", Science, Nov. 21, 2003, vol. 302, pp. 1380-1382.

Klein, D, et al., "A single-electron transistor made from a cadmium selenide nanocrystal", Nature, Oct. 16, 1997, vol. 389, pp. 699-701.

Manna, L., et al., "Controlled growth of tetrapod-branched inorganic nanocrystals", Nature Materials, Jun. 2003, vol. 2, pp. 382-385.

Manna, L., et al., "Synthesis of Soluble and Processable Rod-, Arrow-, Teardrop-, and Tetrapod-Shaped CdSe Nanocrystals", J. Am. Chem. Soc., 2000, vol. 122, pp. 12700-12706.

Mokari, T., et al., "Synthesis and Properties of CdSe/ZnS Core/Shell Nanorods", Chem. Mater., 2003, vol. 15, pp. 3955-3960.

Murray, C.B., et al., "Synthesis and Characterization of Nearly Monodisperse CdE (E=S, Se, Te) Semiconductor Nanocrystallites", J. Am. Chem. Soc., 1993, vol. 115, pp. 8706-8715.

Nahum, E., et al., "Transport and Charging in Single Semiconductor Nanocrystals Studied by Conductance Atomic Force Microscopy", Nano Letters, 2004, vol. 4, No. 1, pp. 103-108.

Peng, X. et al., "Shape control of CdSe nanocrystals", Nature, Mar. 2000, vol. 404, pp. 59-61.

Peng, Z, et al., "Mechanisms of the Shape Evolution of CdSe Nanocrystals", J. Am. Chem. Soc., 2001, vol. 123, pp. 1389-1395.

Talapin, D. et al., "Highly Emissive Colloidal CdSe/CdS Heterostructures of Mixed Dimensionality", Nano Letters, 2003, vol. 3, No. 12, pp. 1677-1681.

Tang, Z. et al., "Spontaneous Organization of Single CdTe Nanoparticles into Luminescent nanowires", Science, Jul. 12, 2002, vol. 297, pp. 237-240.

Wu, Y. et al., "Block-by-Block Growh of Single-Crystalline Si/SiGe Superlattice Nanowires", Nano Letters, 2002, vol. 2, No. 2, pp. 83-86.

Yamamoto, M. et al., "Novel preparation of monodispersed silver nanoparticles via amine adducts derived from insoluble silver myristate in tertiary alkylamine", J. Mater. Chem., 2003, vol. 13, pp. 2064-2065.

Yan, H. et al., "DNA-Templated Self-Assembly of Protein Arrays and Highly Conductive Nanowires", Science, Sep. 26, 2003, vol. 301, pp. 1882-1884.

Yu, W. et al., "Formation and Stability of Size-, Shape-, and Structure-Controlled CdTe Nanocrystals: Ligand Effects on Monomers and Nanocrystals", Chem. Mater., 2003, vol. 15, pp. 4300-4308.

Alfredo M. Morales et al., "A Laser Ablation Method for the Synthesis of Crystalline Semiconductor Nanowire", Science, vol. 279, Jan. 9, 1998, pp. 208-211.

Wendy U. Huynh et al., "Hybrid Nanorod-Polymer Solar Cells", Reports, Science, vol. 295, Mar. 29, 2002, pp. 2425-2427.

Miri Kazes et al., "Lasing From Semiconductor Quantum Rods in a Cylindrical Microcavity", aDV. mATER. 2002, vol. 14, No. 4 pp. 317-321.

Guangtao Li et al., "Spherical and Planar Gold(0) Nanoparticles with a Rigid Gold(I)-Anion or a Fluid Gold(0)-Acetone Surface", 2003 American Chemical Society, vol. 19 pp. 6483-6491.

R. Krupke et al., "Contacting single bundles of carbon nanotubes with altering electric fields", Applied Physics A, Materials Science & Processing, Oct. 28, 2002, pp. 397-400.

Michal Jacobson et al., "Size Dependence of Second Harmonic Generation in CDSE Nanocrystal Quantum Dots", Depart. of Physical Chemistry and the Farkas Center for Light-Induced Processes, The Hebrew University of Jerusalem, vol. 104, No. 1, Jan. 13, 2000.

W. Rechberger et al., "Optical Properties of Two Interacting Gold Nanoparticles", Optics Communications, vol. 220, 2003, pp. 137-141.

C. Sonnichsen et al., "Drastic Reduction of Plasmon Damping in Gold Nanorods", Photonics and Optoelectronics Group, Physics Depart. and CeNSvol. 88, No. 7, Feb. 18, 2002, pp. 1-4.

R. Solanki et al., "Atomic Layer deposition of ZnSe/CdSe superlattice Nanowires", Applied Physics Letters, vol. 81, No. 20, Nov. 11, 2002, pp. 3864-3866.

Taleb Mokari et al., "Selective Growth of Metal Tips onto Semiconductor Quantum Rods and Tetrapods", Reports, vol. 304, Jun. 18, 2004, pp. 17871790.

Young-Wook Jun et al., "Controlled Synthesis of Multi-armed CdS Nanorod Architectures Using Monosurfactant System", J. Am. Chem. Soc. 2001, vol. 123, pp. 5150-5151.

* cited by examiner

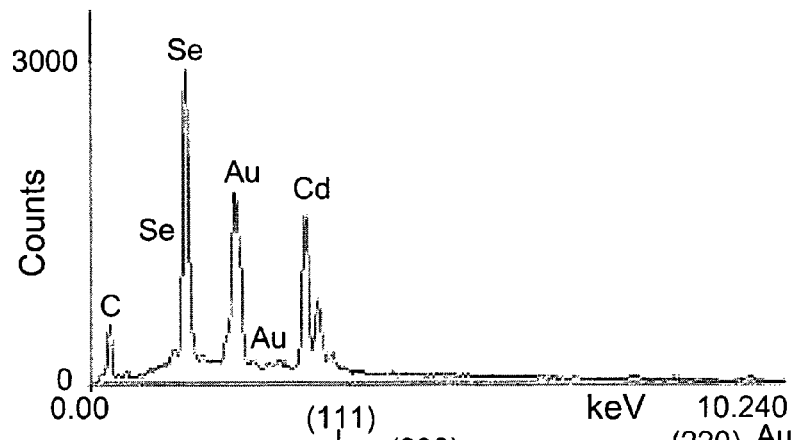
FIG. 2A
FIG. 2B
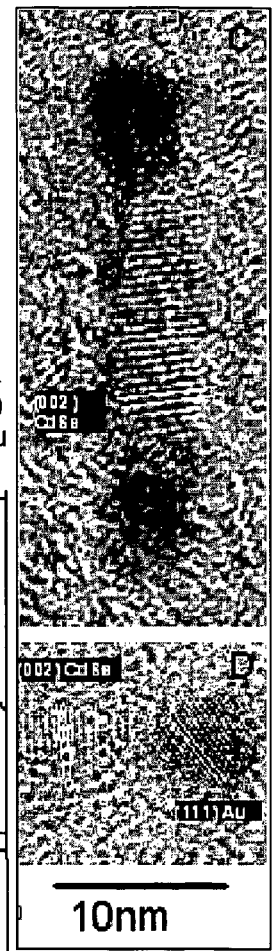
FIG. 2C
FIG. 2D

NANOSTRUCTURES AND METHOD FOR SELECTIVE PREPARATION

FIELD OF THE INVENTION

This invention relates to the field of nanomaterials.

LIST OF REFERENCES

The following references are considered to be pertinent for the purpose of understanding the background of the present invention:
1. M. S. Gudiksen, L. J. Lauhon, J. Wang, D. Smith, and C. M. Lieber, Nature 415, 617 (2002).
2. Y. Wu, R. Fan, P. Yang, Nano Lett. 2, 83 (2002).
3. D. V. Talapin, R. Koeppe, S. Goltzinger, A. Kornowski, J. M. Lupton, A. L. Rogach, O. Benson, J. Feldmann, and H. Weller, Nano Lett. 3, 1677 (2003).
4. WO 03/097904
5. WO 03/054953
6. Y. Cui and C. M. Lieber, Science 291, 851 (2001).
7. S. Heinze, J. Tersoff, R. Martel, V. Derycke, J. Appenzeller, and Ph. Avouris, Phys. Rev. Lett. 89, 106801 (2002).
8. A. Javey, J. Guo, Q. Wang, M. Lundstrom and H. Dai, Nature 424, 654 (2003).
9. Z. A. Peng, X. Peng, J. Am. Chem. Soc. 123, 1389 (2001).
10. J. E. Cretier and G. A. Wiegers, Mat. Res. Bull. 8, 1427 (1973).
11. W. W. Yu, Y. A. Wang, X. Peng, Chem. Mater. 15, 4300 (2003).
12. D. Coucouvanis, Prog. Inorg. Chem. 11, 233 (1970);
13. Jun Y.W.; Lee S. M.; Kang N. J.; Cheon J.; J. Am. Chem. Soc. 123, 5150 (2001).
14. U.S. Pat. No. 5,505,928.
15. L. Manna, D. J. Milliron, A. Meisel, E. C. Scher, A. P. Alivisatos, Nat. Mat. 2, 382 (2003).
16. T. Mokari, U. Banin, Chem. Mater. 15, 3955 (2003).
17. E. Nahum et al., Nano Lett. 4, 103 (2004).

The above references will be acknowledged in the text below by indicating their numbers [in brackets] from the above list.

BACKGROUND OF THE INVENTION

Anisotropic growth of nanomaterials has led to the development of complex and diverse nano-structures such as rods, tetrapods, prisms, cubes and additional shapes. These architectures display new properties and enrich the selection of nano-building blocks for electrical, optical and sensorial device construction. Even greater complexity and new function is introduced into the nanostructure by anisotropic growth with compositional variations. This has been elegantly realized by growing semiconductor heterostructures such as p-n junctions and material junctions in nanowires [1,2], and in the case of colloidal nanocrystals, in growth of rodlike CdSe/CdS core-shell particles [3] from spherical CdSe core nanocrystals and in complex branched growth.

A process for the preparation of nanocrystalline semiconductors, having rod-like shape of controlled dimensions is described in U.S. Pat. No. 5,505,928 [13] and in WO 03/097904 [4] for especially Group III-V semiconductors, [4]. Nanocrystal particles having core with first crystal structure, and at least one arm with second crystal structure are described in WO 03/054953 [5].

Recently there have been several reports relating to connectivity formation for micron-long quasi-one-dimensional structures such as nanotubes and nanowires [6, 7, 8]. However, wiring of shorter semiconductor nanoparticles such as rods and tetrapods, with arm lengths of less then 100 nm has not been achieved yet.

SUMMARY OF THE INVENTION

There is a need in the art for new nanostructures having selective, well-defined anchor points grown upon them for use in self-assembly in solution and onto substrates and for electrical or chemical connectivity. Such nanostructures and method for their manufacture are not available to date.

Examples of desired nanostructures with well-defined anchor points would be nanoparticles having elongated shapes with different tips e.g. metal tips, grown onto at least one end portion thereof, in a controllable and repeatable manner that would also provide an electrical and/or chemical contact point. The different zones grown onto the nanoparticles end portion would provide well-defined anchor points onto which selective chemistries could be used to generate self-assembled structures of controlled arrangements.

The present invention thus provides in a first aspect nanostructure having at least one elongated structure element comprising a first material, where the elongated structure element bears on at least one of its end portions a second material that differs from the first material in at least one property selected from: electrical conductivity, chemical reactivity (i.e. the property of binding, where "binding" refers to covalent binding, electrostatic interaction or other close association between molecules) and composition.

The first material may be made of metal, semiconductor or insulating material or mixtures thereof. The second material comprises of metal or metal alloy. In such case the second material differs from the first material in electrical conductivity and/or chemical reactivity and/or composition. Alternatively, the second material comprises conductive polymer, semiconductor, insulating material or mixtures thereof. In such case the second material differs from the first material in at least one property selected from electrical conductivity, chemical reactivity and composition.

In a preferred embodiment the present invention provides new nanoscale structures in which a metal or metal alloy tip (conductive zone) is present on at least one of the end portions of the nanostructure. The novel nanostructures have an elongated shape such as wire, tube, rod, bipod, tripod and tetrapod. The nanostructures of the present invention differ from the nanotubes and nanowires bearing electrodes formed by evaporation, described in references [6-8] above since the electrodes of the prior art were formed on some region of the tube or wire and not on their tips.

Preferably, the nanostructures of the invention have at least one elongated structure element comprising a first material, where said elongated structure element bears on at least one end portion thereof a second material selected from metal and metal alloy. The first and second materials differ in their electrical conductivity and/or chemical reactivity and/or composition.

The term "material" in the context of the present invention relates to any solid substance of which the nanostructures of the invention are made, that may be composed of one or more elements or ingredients. Alloys, composites, layered structures and matter formed by chemical union of two or more elements or ingredients are also within the scope of this definition.

The first material mentioned above is selected from semiconductor material, insulating material, metal and mixtures thereof. Preferably, the first material is a semiconductor material selected from Group II-VI semiconductors, Group III-V semiconductors, Group IV-VI semiconductors, Group IV semiconductors, alloys made of these semiconductors, combinations of the semiconductors in composite structures and core/shell structures of the above semiconductors. Even more preferably, the nanostructures are made from Group II-VI semiconductors, alloys made from Group II-VI semiconductors and core/shell structures made from Group II-VI semiconductors. Specific examples of Group II-VI semiconductors are CdSe, CdS, CdTe, ZnSe, ZnS, ZnTe alloys thereof, combinations thereof and core/shell layered-structures thereof.

The first material is different than the second material in at least one property selected from electrical conductivity, chemical reactivity and composition. The second material may be a metal, metal alloy, insulating material, conductive polymer or semiconductor. Examples of preferred metals are transition metals such as for example Cu, Ag, Au, Pt, Co, Pd, Ni, Ru, Rh, Mn, Cr, Fe, Ti and alloys of such metals. Examples of conductive polymers, including composites and metal doped conductive polymers, are polyaniline, polypyrrole, polythiophene, composites thereof or doped versions thereof. Examples of semiconductors for use as the second material are Group II-VI semiconductors, Group III-V semiconductors, Group IV-VI semiconductors, Group IV semiconductors, alloys made of these semiconductors and combinations of the semiconductors in composite structures.

For nanostructures composed of semiconductor for both first and second materials, such that an elongated nanostructure is made of a first semiconductor that has formed on at least one of its end portions a zone made of a second semiconductor, in such case the second semiconductor material is different than the first semiconductor in at least one of the following properties: electrical conductivity, chemical reactivity, band gap and composition. This kind of nanostructures of the present invention are different from those described in Reference [3] where CdSe dots are surrounded by a CdS shell that is elongated in one direction. The nanostructures described in reference [3] are also grown in a completely different method starting from the dot and growing the shell around it which is then elongated. Examples of suitable semiconductor materials for use as the first or second material are herein described.

The present invention provides, in another of its aspects, a method for forming a zone on at least one end portion of a nanostructure, wherein that zone differs from the whole nanostructure, the method comprising: contacting a solution comprising nanostructures composed of at least one elongated structure element, with a solution comprising an agent selected from metal source, metal alloy source, conductive polymer source, insulating material source (e.g. such as oxides and organic materials) and semiconductor source, to obtain upon isolation nanostructures bearing at least one zone on said at least one elongated structure thereof that differs from the nanostructure in at least one property selected from: electrical conductivity, chemical reactivity and composition.

In a preferred embodiment, the method of the invention comprises: contacting a solution comprising nanostructures composed of at least one elongated structure element, with a solution comprising metal source or metal alloy source, to obtain upon isolation nanostructures bearing at least one zone comprising metal or metal alloy on said at least one elongated structure thereof, where the metal or metal alloy zone differs from the whole elongated element in electrical conductivity and/or chemical reactivity and/or composition.

The method is carried out in solution, at a temperature between about −40° C. to about 400° C., preferably between about 10° C. to about 80° C., more preferably between about 20° C. to about 30° C. and even more preferably at room temperature.

According to a preferred embodiment the reaction is carried out in the presence of at least one of the following agents in addition to said nanostructures and metal source of conductive second material: electron donor, surfactant and stabilizer. In a specific embodiment the same agent may function as electron donor, and/or surfactant and/or stabilizer.

The nanostructures used in the method of the invention have an elongated shape, for example of rods, wires, tubes, or in branched form. More preferably the nanostructures have an elongated shape such as for example nanorods and branched shape such as bipods, tripods, tetrapods and the like. The term "nanorod" or "rod" as used herein is meant to describe a nanoparticle with extended growth along the first axis while maintaining the very small dimensions of the other two axes, resulting in the growth of a rod-like shaped nanocrystal of very small diameter in the range of about 1 nm to about 100 nm, where the dimensions along the first axis may range from about several nm to about 1 micrometer. The term "tetrapod" is meant to describe a shape having a core from which four arms are protruding at tetrahedral angles. In the case of nanorods, the resulting structures after treating them with the metal or metal alloy source are shaped as "nano-dumbbells".

The nanostructures have an elongated shape or even a branched shape and serve as a template at the nanometer level for the deposition of a conducting material, and as it will be described and exemplified herein below, the deposition is accomplished in a controllable manner on at least one end portion of the elongated elements of the nanostructures.

The nanostructures are made of a first material comprising semiconductor material, insulating material, or mixtures thereof. Preferably, the nanostructures are made of semiconductor material selected from Group II-VI semiconductors, such as for example CdS, CdTe, ZnS, ZnSe, ZnO, HgS, HgSe, HgTe and alloys (e.g. CdZnSe); Group III-V semiconductors such as InAs, InP, GaAs, GaP, InN, GaN, InSb, GaSb, AlP, AlAs, AlSb and alloys (e.g. InAsP, CdSeTe, ZnCdSe, InGaAs and the like); Group IV-VI semiconductors such as PbSe, PbTe and PbS and alloys; and Group IV semiconductors such as Si and Ge and alloys. Additionally, combinations of the above in composite structures consisting of sections with different semiconductor materials, for example CdSe/CdS or any other combinations, as well as core/shell structures of different semiconductors such as for example CdSe/ZnS core/shell nanorods, are also within the scope of the present invention.

The nanostructures may also be made of an insulating material such as for example oxides and organic materials or, alternatively the nanostructures are made of metals. Examples of oxides are silicon oxide, titanium dioxide, zirconia. Metals include Au, Ag, Cu, Pt, Co, Ni, Mn and the like, and various combinations and alloys thereof. Organic materials suitable for use in the nanostructures are for example polymers.

The metal or metal alloy source used in the method of the present invention for the fabrication of the conductive zone at the end portion of an elongated structure element preferably comprises a transition metal or mixture of such metals. A variety of metals may be used. This includes noble metals such as Cu, Ag, Au, or other transition metal elements such as Pt, Co, Pd, Ni, Ru, Rh, Mn, Cr, Fe, Ti and the like. The metal growth procedure is done by using a proper metal salt source, for example $AuCl_3$ for Au growth, $Ag(CH_3COO)$ for silver growth, $Cu(CH_3COO)_2$ for Cu growth, $PtCl_4$ or Pt(acetylacetonate) for Pt growth, Ni(cyclooctadiene)$_2$ for Ni growth, CO$_2$(CO)$_8$ or CoCl$_2$ for Co growth, and Pd(NO$_3$)$_2$ for Pd growth.

The metal salts are dissolved in a proper organic solvent such as hydrocarbons, e.g. hexanes, cyclohexanes, etc., aromatic solvents e.g. toluene, etc., using a proper surfactant and/or stabilizer that stabilizes the nanostructures and the metal salt by preventing aggregation. The organic solvent used in the method of the present invention is one capable to solubilize both the nanostructure and the metal source.

Examples of surfactants are cationic surfactants such as ammonium salts, alkyl pyridinium and quaternary ammonium salts. More specific examples are tetrabutylammonium borohydride (TBAB), di-dodecyldimethylammonium bromide (DDAB), cetyltrimethylammonium bromide (CTAB), and salts of quaternary ammonium with acetate group ions such as acetate group ions, pivalate, glycolate, lactate and the like.

Stabilizer compounds used in the method of the invention are such compounds capable to coordinate to the nanostructure surface and/or the metal particle surface and hence prevent aggregation of the nanostructures. Examples of stabilizers are aliphatic amines, e.g. hexadecylamine, dodecylamine, octylamine, alkylthiols, e.g. hexane thiol, decylthiol, dodecylthiol, etc. and carboxylic stabilizers such as myristic acid, palmitic acid and citrate.

The metal or metal alloy salt is first dissolved in an organic solvent comprising a surfactant and a stabilizer to give a solution which is subsequently added in a controllable manner and a suitable temperature to the nanostructures solution.

When an electron source is desired in the method of the invention, an electron donor compound may be used. Examples of electron donors are organic compounds, such as aliphatic amines, hydrides such as sodium borohydride and the like, ascorbic acid and other reducing agents. A stabilizer can also serve as an electron donor, for example an aliphatic amine. A surfactant can also serve as an electron donor, for example tetrabutylammonium borohydride (TBAB). According to another example the electron source is obtained from an electron beam device. Alternatively, one may use electromagnetic radiation such as that from a light source including a lamp or laser in order to excite the nanoparticles or the metal source.

In another preferred embodiment, the present invention provides a method for forming in solution medium an electrically conductive zone on a nanostructure having at least one elongated structure, the method comprising: contacting an organic solution comprising semiconductor nanostructures composed of at least one elongated structure element, with an organic solution comprising a metal or metal alloy source, a stabilizer and/or surfactant to obtain upon precipitation semiconductor nanostructures bearing at least one electrically conductive zone on said at least one elongated structure thereof. Preferably, the nanostructures used in the method of the invention are in the form of nanorods, tetrapods or any other branched structure and are made of elements of Group II-VI, alloys of such elements or core-shell layered structures thereof.

The method of the present invention provides new functionalities to the nanostructures, the most important of which are the formation of reactive anchor points for directed self assembly and for electrical or chemical connectivity. The selective tip growth of metal contacts provides the route to an effective wiring scheme for soluble and chemically processable nanostructures with branched shapes. This would allow to fully realize the potential of miniaturization of devices using such nano-building blocks, while employing the powerful principles of self-assembly to connect them to the 'outside' world.

Nanostructures obtainable by the method of the invention are within the scope of the invention.

Electronic and optical devices comprising the nanostructure of the invention or into which the nanostructure of the invention is integrated are also within the scope of the invention. Non-limiting examples are electrodes, transistors e.g. field effect transistor, memory devices, and the like and self assembled constructs comprising a plurality of nanostructures, wherein each nanostructure is linked to another nanostructure in the construct through its conductive zone.

BRIEF DESCRIPTION OF THE DRAWINGS

In order to understand the invention and to see how it may be carried out in practice, preferred embodiments will now be described, by way of non-limiting example only, with reference to the accompanying drawings, in which:

FIG. 1 illustrates TEM (Transmission Electron Microscopy) images A-D showing growth of Au onto CdSe quantum rods of dimensions 29×4 nm (length×diameter).

FIG. 2A illustrates the EDS (Energy dispersive X-ray spectroscopy) spectrum of a gilded CdSe rod sample. The relative atom percentage of Au:Cd:Se is 18%:42%:40%.

FIG. 2B illustrates a powder X-ray diffraction comparing CdSe rods before (1), and after (2) Au growth.

FIGS. 2C and D illustrate HRTEM images of a single nano-dumbbell and a nano-dumbbell tip, respectively. The CdSe lattice for the rod in the center, and Au tips at the rod end portions, can be identified as marked.

FIG. 9 illustrates TEM images A-D showing one-sided growth of Au on tips of CdSe quantum rods having different sizes: FIG. 9A—18×3.5 nm; FIG. 9B—25×4 nm; FIG. 9C—50×4 nm.

DETAILED DESCRIPTION OF THE INVENTION

The method is exemplified hereinbelow with reference to selective growth of metal tips onto semiconductor nanorods and tetrapods.

In a method for selective growth of contacts made of gold, AuCl₃ was dissolved in toluene by use of di-dodecyldimethylammonium bromide (DDAB) and dodecylamine, and the resulting solution was added to a toluene solution comprising of colloidal grown nanorods or tetrapods. The method is exemplified for the prototypical CdSe nanocrystal system that is highly developed synthetically and widely studied for its size and shape dependent properties.

CdSe rods and tetrapods of different dimensions (see below), were prepared by high temperature pyrolisys of suitable precursors, in a coordinating solvent containing a mixture of trioctylphosphineoxide (TOPO), and of phosphonic acids [9]. In a typical Au growth reaction, a gold solution was prepared containing 12 mg AuCl₃ (0.04 mmol), 40 mg of DDAB (0.08 mmol) and 70 mg (0.37 mmol) of dodecylamine in 3 ml of toluene and sonicated for 5 minutes at room temperature. The solution changed color from dark orange to light yellow. 20 mg (1×10⁻⁸ moles of rods, where each rod has about 7000 CdSe units) of CdSe quantum rods with 29×4 nm size, were dissolved in 4 ml toluene in a three neck flask under argon. The gold solution was added drop-wise over a period of three minutes. During the addition, carried out at room temperature, the color gradually changed to dark brown. Following the reaction, the rods were precipitated by addition of methanol and separated by centrifugation. The purified product could then be redissolved in toluene for further studies.

Figures 1A, 1B, 1C, 1D:
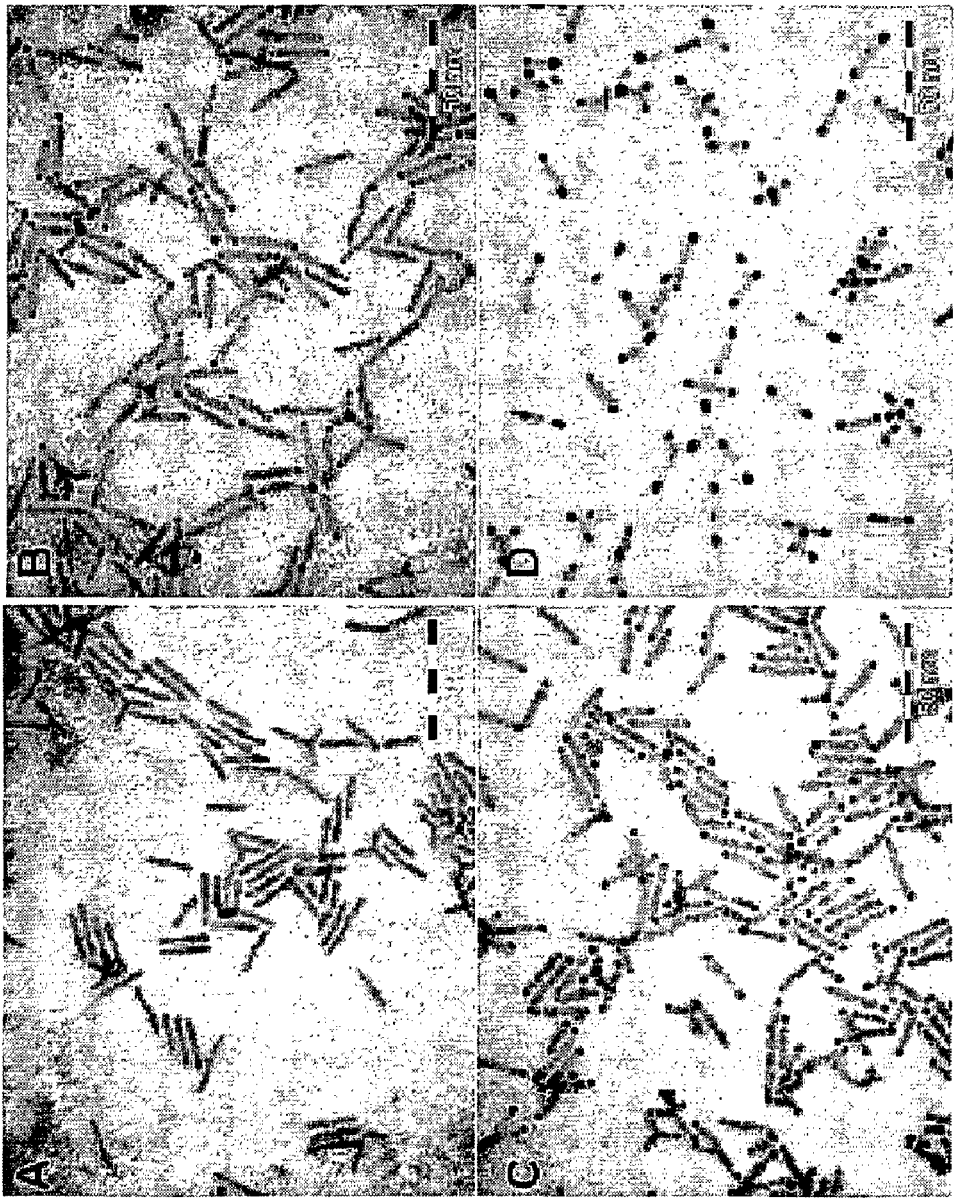
FIG. 1A shows the rods before Au growth.
FIG. 1B shows selective Au growth of about 2.2 nm.
FIG. 1C shows selective Au growth of about 2.9 nm.
FIG. 1D shows selective Au growth of about 4 nm.
Figure 3A:
FIGS. 3A and 3B: 12×4 nm quantum rods before and after Au growth, respectively.
Figure 3B:
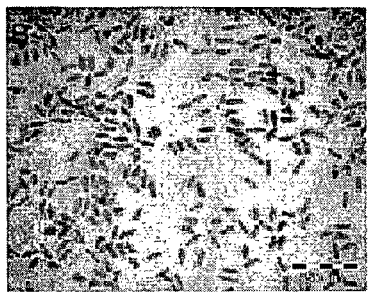
Figure 3C:
FIGS. 3C and 3D: 29×4 nm quantum rods before and after Au growth, respectively.
Figure 3D:
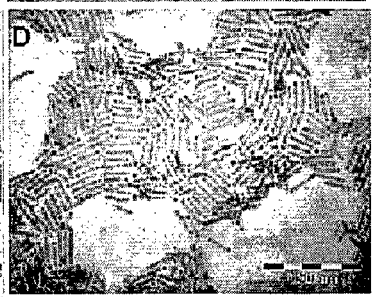
Figure 3E:
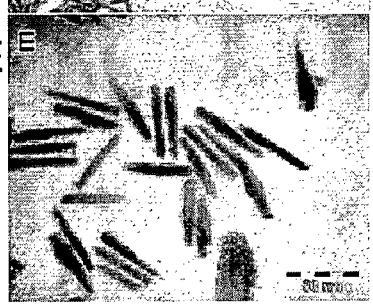
FIGS. 3E and 3F: 60×6 nm quantum rods before and after Au growth, respectively. Au growth on CdSe tetrapods showing a general view is presented in FIG. 3G and higher magnification image for one tetrapod is presented in FIG. 3H.
Figure 3F:
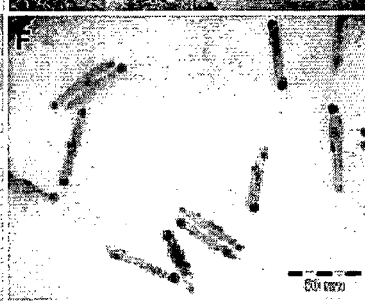
Figure 3G:
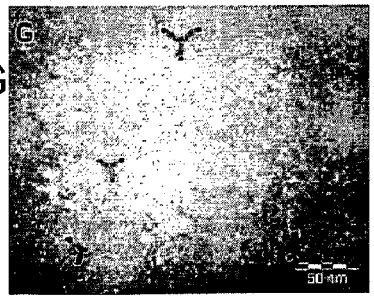
FIG. 3 illustrates TEM images A-H showing growth of Au on tips of various CdSe quantum rods and CdSe tetrapods.
Figure 3H:
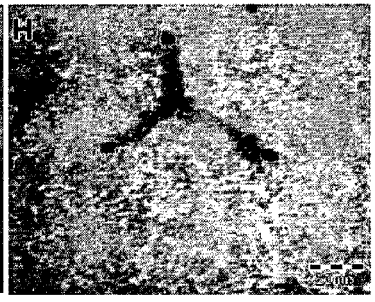

FIG. 1 presents transmission electron microscopy (TEM) images showing growth of Au onto CdSe quantum rods of dimensions 29×4 nm (length×diameter). FIG. 1A shows the rods before Au growth, while in FIGS. 1B-D, selective Au growth onto the rod tips is clearly identified as the appearance of points with enhanced contrast afforded by the higher electron density of the Au compared with CdSe. The rods now appear as 'nano-dumbbells'. Moreover, by controlling the amount of initial Au precursor, it is possible to control the size of the Au tips on the nano-dumbbell end portions, from ~2.2 nm in FIG. 1B, to ~2.9 nm in FIG. 1C, to ~4.0 nm in FIG. 1D as summarized in Table 1. The procedure clearly leads to the growth of natural contact points on the tips of the rods.

TABLE 1

| Sample | NC's[1] amount (mg) | DDA[2] amount (mg) | DDAB[3] amount (mg) | AuCl₃ amount (mg) | Rods size (L × D) nm | Gold ball size (nm) |
|---|---|---|---|---|---|---|
| 1 | — | — | — | — | 29 × 4 nm | (original rod) |
| 2 | 10 mg | 40 mg | 25 mg | 4 mg | 25.6 × 3.3 nm | 2.22 nm |
| 3 | 10 mg | 90 mg | 50 mg | 8 mg | 23.9 × 3.4 nm | 2.9 nm |
| 4 | 10 mg | 160 mg | 100 mg | 13.5 mg | 20.8 × 3.2 nm | 4 nm |

[1]NC—nanocrystals
[2]DDA—dodecylamine
[3]DDAB—didodecyldimethylamonium bromide

Figure 5C:
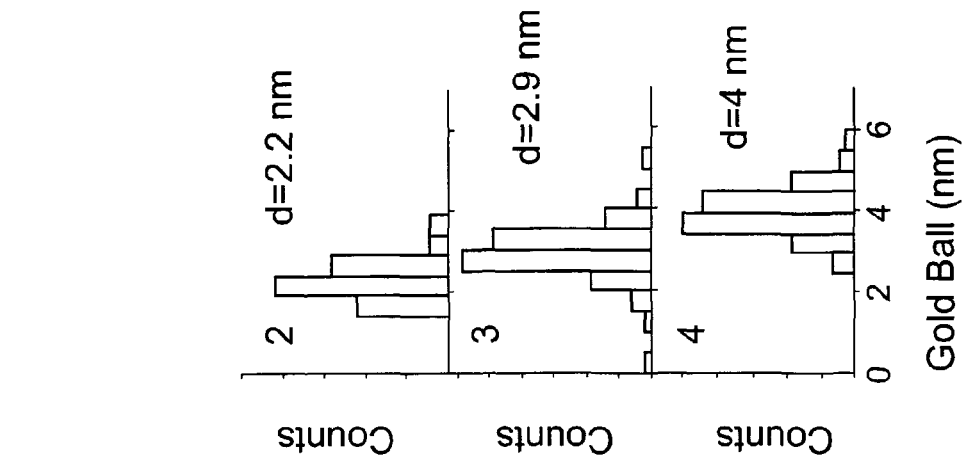
FIG. 5 shows sizing histograms for gilded rods shown in FIG. 1. Histograms for rod diameter (FIG. 5A), length (FIG. 5B) and Au diameter (FIG. 5C) are shown for the four samples: 1. Original 29×4 nm rods, 2. Rods (10 mg) after treatment with 4 mg AuCl₃, 25 mg DDAB and 40 mg dodecylamine. 3. Rods (10 mg) after treatment with 8 mg AuCl₃, 50 mg DDAB and 90 mg dodecylamine. 4. Rods (10 mg) after treatment with 13.5 mg AuCl₃, 100 mg DDAB and 160 mg dodecylamine.
Figure 5B:
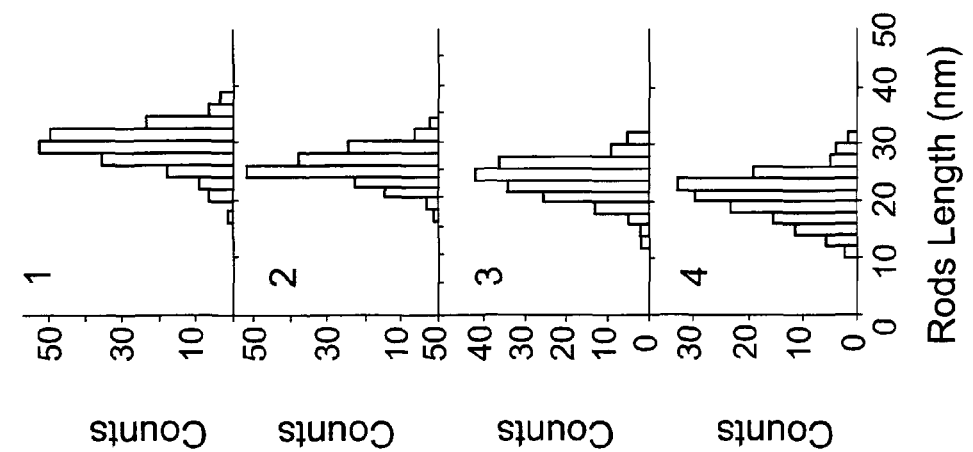
Figure 5A:
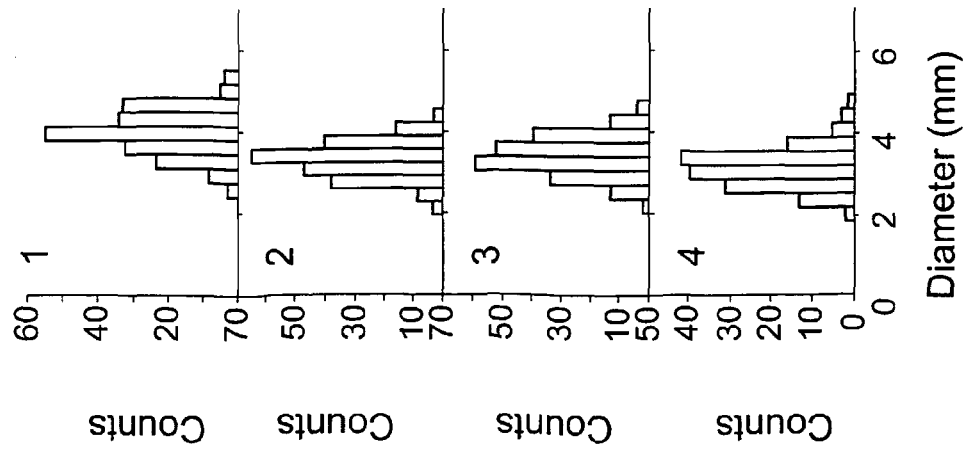

An additional observation from the analysis of ~200 particles per sample is that the overall rod length becomes shorter upon Au growth, and there is also a decrease in the average diameter of the rods, (Table 1 and FIG. 5 for the complete sizing histograms). Control experiments with the DDAB and dodecylamine without AuCl₃ were carried out and also in that case the average rod dimensions decreased, implying that reduction of rod size is perhaps related to dissolution of rods in the presence of DDAB and not to the Au growth.

Several structural and chemical characterization methods have been carried out in order to verify the material content and structure of the gold on the rod tips. FIG. 2A shows EDS analysis of a micron area of rods after growth and the appearance of Au in the gilded (i.e. goldenized) and purified rod sample is clear. The powder Xray-diffraction pattern for the 29×4 nm rod sample comparing the rods before and after gold growth is shown in FIG. 2B. The appearance of the Au (111), (200) and (220) peaks following Au growth is evident, demonstrating crystalline Au is formed on the tips.

Further evidence for Au growth onto single rods, is provided by HRTEM (high resolution TEM) studies of the nano-dumbbells. FIG. 2C shows a HRTEM image of a single rod after gold treatment. The lattice image for the rod part composed of CdSe corresponds to growth of rods along the CdSe <001> axis. The Au is discerned once again as the region at the end portion with enhanced contrast and the gold lattice is also shown in FIG. 2D.

Relating to the interface at the Au—CdSe, it is suggested that Au—Se bonds are formed, analogous to the known AuSe material [10]. This means that the interface is formed with covalent chemical bonds between the metal and the semiconductor and hence can be expected to provide good electrical connectivity.

The method for selective Au growth could be easily expanded and applied to rods of arbitrary dimensions, and to tetrapods, as well as to growth of other metals and to rods made of various semiconductor materials.

FIG. 3 shows TEM images for three rod samples of dimensions 12×4 nm (FIG. 3A, B), 29×4 nm (FIG. 3C, D), and 60×6 nm (FIG. 3E, F), before and after Au treatment. The presence of the high-contrast tips on the treated rods, forming nano-dumbbells, is evident in all cases. Highly selective tip growth is discerned and demonstrated for three rod sizes and could easily be applied to arbitrary rod sizes. In addition the method was applied to a CdSe tetrapod sample, as can be seen in FIG. 2G showing several tetrapods, and in FIG. 2H showing an enlargement of one tetrapod, following the Au growth process. In this case, the growth occurs selectively on all the tips of the tetrapods leading to a tetrahedral arrangement for the Au tips, and once again providing the natural contact points for this unique structure, for further self-assembly and for electrical connections.

In another example, CdTe nanostructures served as the template for growing various metals on its end portions. The synthesis of the CdTe in different shapes is known [11,14]. In a typical synthesis of CdTe rods, a mixture of 1 mmol of CdO dissolved in 1.125 gr oleic acid and 2.5 gr of 1-octadecene is heated in three neck flask to 300° C. to obtain a clear colorless solution. In the glove box, a solution of Te (0.5 mmol of Te is dissolved in 1 ml of TOP) is prepared and brought out in a vial sealed with septum to the injection. After the injection of the Te solution into the mixture in the three necked flask, the mixture is cooled to 260° C. for growth. Modification of this procedure in terms of the temperature or precursor concentration results in size and shape changes. The oleic acid is used as a ligand and it dissolves the CdO in the octadecene.

Another specific semiconductor material that may be used is CdS, which is controllable in size and shape. The synthesis is based on the same principle which is injection precursor to hot solution, the Cd and S precursor in this case is $Cd(S_2CNEt)_2$ [12]. In typical synthesis of CdS nanorods, a warm solution of $Cd(S_2CNEt)_2$ (50 mg dissolved in about 0.3 g of hexadecylamine (HDA) at about 70° C.) is injected into hot solution of HDA and after 1 hr is cooled to 70° C. and treated with ethanol and separated by centrifuging. Controlling the shape of the nanocrystals is done by changing the growth temperature of the synthesis from 300° C. (rods) to 120° C. (tetrapods).

Metal tips by the method described above have also been grown onto CdSe/ZnS core/shell nanorods (29×4 nm rods with 2 monolayer ZnS shell) with initial emission quantum yield of 2% [15]. Treatment of these rods with DDAB and dodecylamine without Au led to an increased quantum yield of 4%, likely because of the effect of the excess amine. Several Au sizes were grown from about 2 nm to about 4.5 nm Au at the tips of the rods.

Figure 4A:
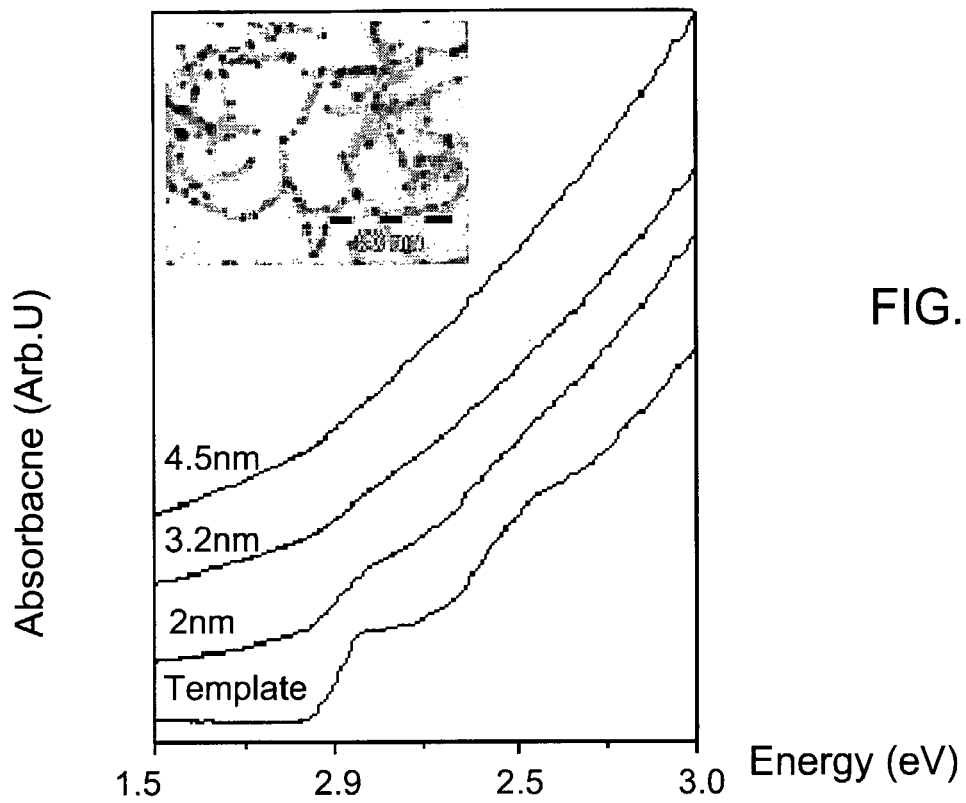
FIG. 4A illustrates the absorption spectra for CdSe/ZnS core/shell nanorod sample with varied Au tip size compared to the original rod template, where Au tip size is indicated for each trace. Spectra are offset vertically for clarity. Inset shows TEM image of the sample after Au growth (scale bar is 50 nm).
Figure 4B:
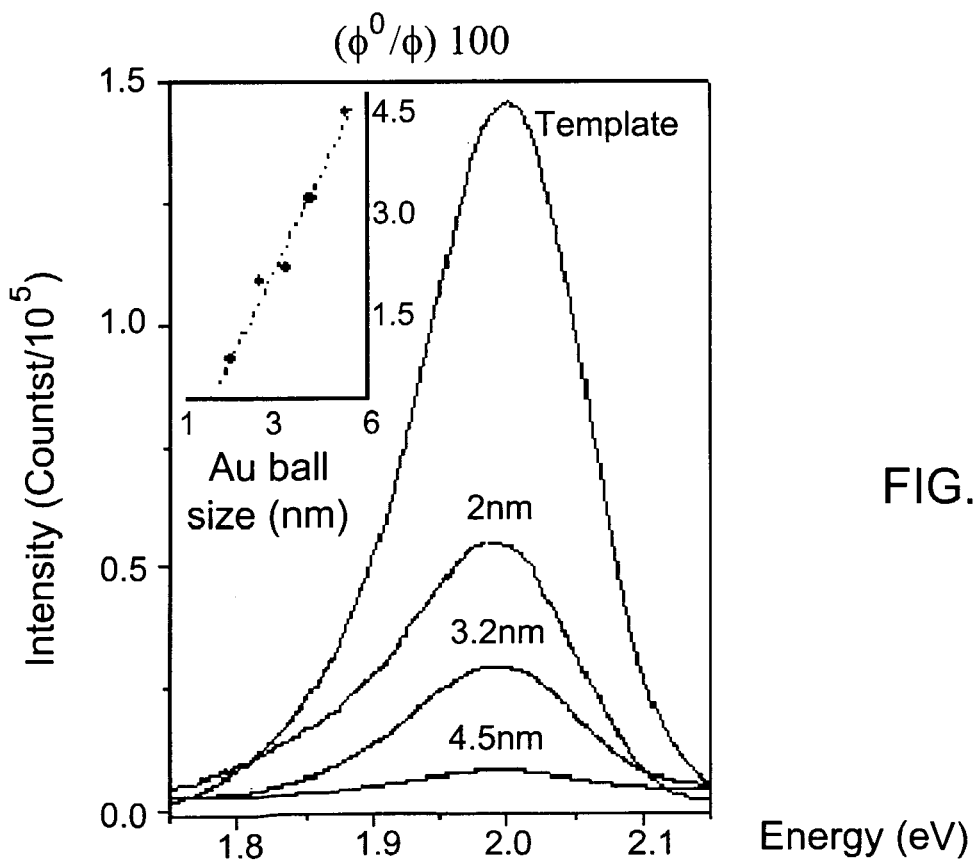
FIG. 4B illustrates the photoluminescence (PL) spectra for CdSe/ZnS core/shell nanorod sample with varied Au tip size compared to the original rod template, where Au tip size is indicated for each trace. Traces were multiplied by 25, 50 and 50 for the 2 nm, 3.2 nm, and 4.5 nm Au tips, respectively, for clarity. Inset shows a plot of relative PL yield for template ($\Phi_0$) over Au-rod ($\Phi$), versus Au ball size. Measurements were performed for rod solutions in a sealed cuvette under Ar using the 454 nm line of an Ar-ion laser with intensity of 100 mW. Fluorescence was collected using identical conditions for all solutions in a right angle configuration with a spectrograph/CCD setup, with 500 ms integration time.

The metalized structures (in the case of Au growth the formed structures are termed herein "gilded structures") exhibit new and different electronic, electrical and optical properties as compared to the original rods, due to the strong effect of the metal on the semiconductor properties. Absorption and photoluminescence (PL) measurements were carried out to study the effect of Au growth on the rod optical properties as shown in FIG. 4. Absorption spectra (FIG. 4A) for the small Au tips on the rods still shows the excitonic structure but with increased absorbance in the visible and the appearance of a tail to the red of the particle gap. Upon increased Au size, the features of the absorption of the rods are washed out and the tail to the red becomes more prominent. The spectra should contain in principle contributions from the semiconductor part and the plasmon resonance associated with the Au tips. However, attempts to add spectra of the rod template and Au nanocrystals did not reproduce the observed absorption and we suggest that the spectra are not a simple sum of both components because of the modified electronic structure of the Au-rod nano-dumbbell system. The strong mixing of the semiconductor and metal electronic states leads to modified density of states exhibiting broadened levels and a reduced band-gap.

The significant coupling of the Au is also observed for the PL (FIG. 4B) that undergoes considerable quenching with increased Au ball size, by a factor of about 100 initially for the smaller Au balls (about 2 nm), and gradually down to a factor of about 500 for the large Au balls (about 4.5 nm). Quenching of the emission by the metal end portions is expected via the new non-radiative pathways created by the proximity of metals, likely leading to electron transfer to the Au. Moreover, a systematic dependence of quenching on Au size is seen as shown in the Stern-Volmer type plot (inset of FIG. 4B). Both absorption and emission spectra exemplify the significant effect of the Au on the semiconductor rod properties in this new system, further proving the strong bonding of the Au to the CdSe rod.

Figure 6B:
FIG. 6B. after exposure to the TEM electron beam—Au patches appear on the rods.
Figure 6A:
FIG. 6 illustrates TEM of product from mixture of rods with AuCl₃ and DDAB without dodecylamine, FIG. 6A. before exposure to the TEM electron beam—aggregated rods are seen.

The selective tip growth of Au onto the rods and tetrapods not only provides important developments for enabling electrical connectivity and new paths for self-assembly for such nanostructures. It is also an interesting and novel chemical reaction route with clear selectivity and anisotropic character. The reaction mechanism for the gold growth entails a reduction of Au. Examining by TEM the Au solution with DDAB and dodecylamine, already reveals the formation of Au particles. When the reaction is carried out without dodecylamine, considerable aggregation of the CdSe rods was seen (FIG. 6A). Additionally, without the amine, growth of Au on rods was not apparent initially and only after the irradiation under the electron beam of the TEM we could observe some Au growth (FIG. 6B).

One of the benefits of the method of the present invention is its specificity leading to selective tip growth. This results from the preferential adsorption of the metal, e.g. Au complex formed in the Au solution by adding Au salt to DDAB and dodecylamine onto the nanostructures end portions. The tips are more reactive due to the increased surface energy and also possibly due to imperfect passivation of the ligands on these faces, which also leads to preferential growth along the <001> axis of CdSe rods. Once Au nucleates on the end portion, it is preferential for additional Au to adhere and grow on that seed. This gains support from controlling the extent of Au growth on the rod tips by using increased concentration of Au in the gold solution as was shown in FIG. 1. Moreover, early Au growth as shown in FIG. 1B reveals that in some rods preferential early growth occurs on one tip, in agreement with the surfactant-controlled growth model suggested for CdSe rods [9].

Figure 9B:
Figure 9D:
FIG. 9D—the same as (C) with different gold tip size.
Figure 9A:
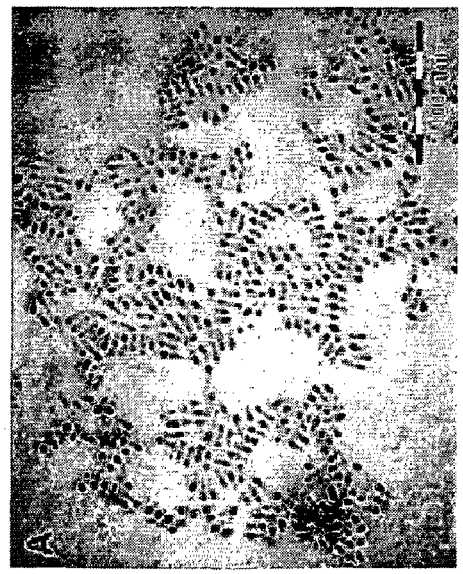
Figure 9C:
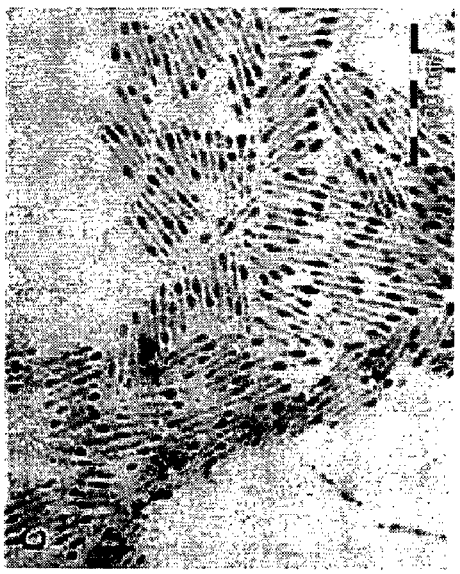

Under different conditions it is also possible to achieve growth of the metal only on part of the end portions of the nanostructure. Thus, for example, when the nanostructure is in the form of rod, it is possible under suitable conditions to perform metallization only on one end out of the two end portions of the rod forming so called 'monobells'. This performance is exemplified in FIG. 9 showing one sided growth of Au on CdSe nanorods of various dimensions: FIG. 9A—18×3.5 nm; FIG. 9B—25×4 nm; FIG. 9C—50×4 nm; FIG. 9D—the same as (C) with different gold tip size.

The route for one-sided growth involves using higher concentration of Au precursor. In a typical one sided Au growth reaction, a gold solution was prepared containing 2.5 mg $AuCl_3$ (0.008 mmol), 20 mg of DDAB (0.04 mmol) and 35 mg (0.185 mmol) of dodecylamine in 4 ml of toluene and sonicated for 5 minutes at room temperature. The solution changed color from dark orange to light yellow. 0.8 mg ($2.35 \times 10^{-10}$ moles of rods) of CdSe quantum rods with the size 50×4 nm were dissolved in 20 ml toluene in a three neck flask under argon. In the case of 25×4 nm rods size, 0.9 mg ($4.8 \times 10^{-10}$ moles of rods) were dissolved in 20 ml toluene with keeping the same gold solution amounts. The gold solution was added drop-wise over a period of three minutes. During the addition, carried out at room temperature, the color gradually changed to dark brown. In the monobells synthesis (one sided growth) as mentioned here, the mole ratio of Au to nanorods is significantly higher as compared with the nano-dumbbell (two sided growth) case. One sided growth is desirable for some self-assembly schemes and also for different non-linear optical properties such structures may reveal in optical applications. Additionally, a one sided grown structure has intrinsic asymmetry and can serve as a diode element.

It is important to note that in some cases Au growth was identified on branching and defect points, but at slower rate compared to the distinctive tip growth discussed above. This can be seen in FIGS. 3E and 3G, where weak dark Au spots appear also in some positions other then the tips of the long rods and tetrapods. This growth can be controlled by the amounts of Au added to the rods. At such defect points, such as points where the diameter of the structure changes, there is also increased reactivity due to the imperfect chemical bonding and increased surface energy. This leads to Au adhesion and growth in agreement with the mechanism for tip growth. It is emphasized that the tip growth occurs more readily and rapidly then growth on the defects and hence can be controlled to achieve contact points.

The method may easily be expanded to additional semiconductor nanocrystal systems and to additional metals, to tailor the metal tip contacts as desired and the semiconductor element as well.

Figure 7:
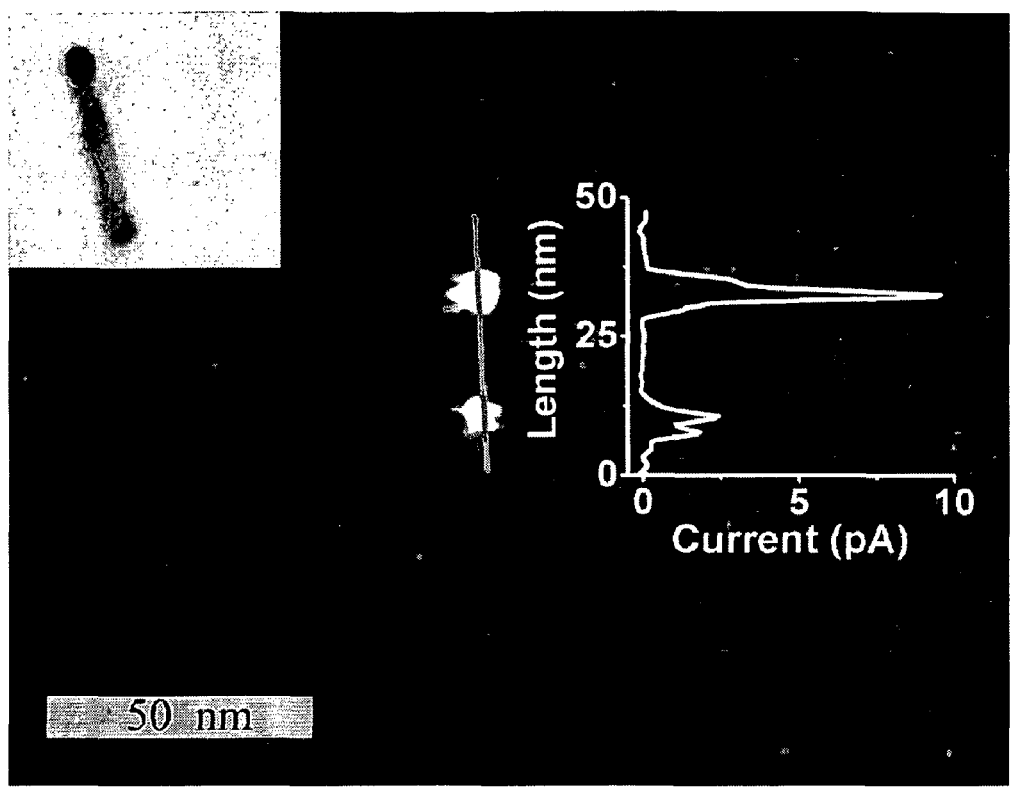
FIG. 7 shows conductive atomic force microscopy current image of single nano-dumbbell measured at a sample bias of 2V. Higher conductance through the Au tips is observed, as seen also by the current cut taken along the rod (along plotted line). In the inset, a TEM image with the same scale of a Au-rod is shown for comparison.

One application for the metal tips is in serving as electrical contact points. The role to be played by the Au tips as contact points for wiring the rods is exemplified by conductive atomic force microscopy (C-AFM) measurements carried out on gilded 60×6 nm rods. Rods were deposited onto a conducting highly ordered pyrrolitic graphite substrate, and embedded in a thin layer of poly methyl methacrylate (PMMA) to avoid dragging by the tip as reported earlier for regular rods [16]. The current image of a single rod measured by this method reveals that already at a bias of 1.5-2 V, small tunneling current is flowing through the tips which are composed of Au, while the central part of the rod consisting of the semiconductor is non-conductive at these conditions (see FIG. 7). The small tunneling current is determined by the tunneling barriers at tip-nanocrystal and nanocrystal-substrate junctions, dominated primarily by the PMMA. This measurement reveals the significantly higher conductance of the Au tips which would be critical for using them as electrical contact points.

Several strategies can be employed to realize such contacts. It is possible to form the metallized nanorods or other branched structures onto a substrate, identify their position, and then write by electron-beam lithography electrodes to overlap with the Au tips. In a different approach, it is also possible to deposit the metallized rods onto pre-existing electrode structures, with or without electrostatic trapping by an applied electric field. Since the metal tipped nanostructures enable the connectivity to electrode structures, this clearly opens the path for using them as transistors, in sensing applications, and in light emitting or light detecting devices.

The metal end portions can also impart the rods with advantageous and novel optical properties. They exhibit enhanced linear and non-linear optical properties. The polarizability of such a structure may obviously be significantly increased compared with that of the regular rods. For example, enhancement in second, third and higher harmonic generation and also the observation of novel plasmon resonances related to highly controlled distances that could be tailored for the metal tips on rods.

Figure 8:
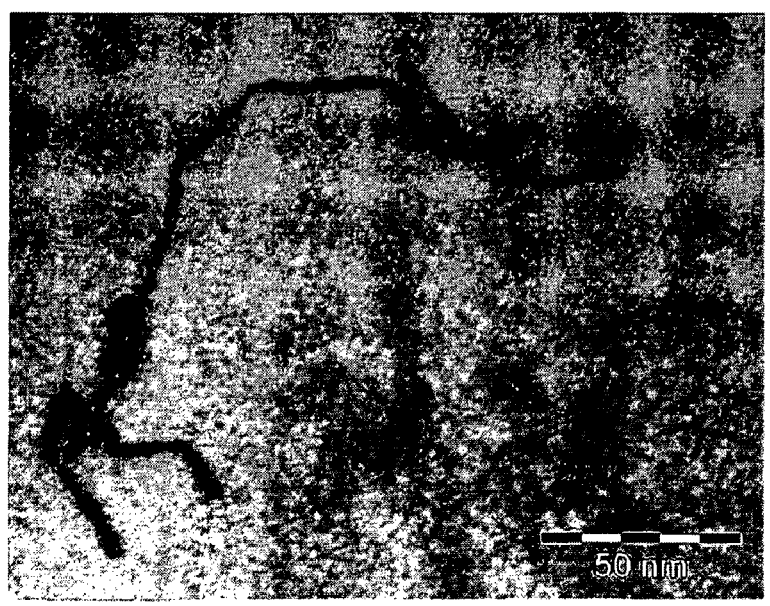
FIG. 8 shows the self assembly of nano-dumbbells into chains formed by adding hexane dithiol bifunctional linker to a solution of nano-dumbbells.

Additionally, is possible to apply the powerful approach of self assembly by using for example, biological templates e.g. DNA, for creating the connections to the metal tips of nanorods or of branched structures, or bifunctional ligands such as dithiols or diamines for binding preferentially to the Au tips. In such applications the metal tips serve as selective anchor points for ligands and chemistries preferential for the Au surface. Such self assembly could for example be done in solution or onto surfaces. In solution, examples include formation of AAAA chains where A represents rods of one type. This is done by adding bifunctional ligands such as dithiols, for example hexane dithiol, to a solution with gilded nanorods. The preferential binding of thiols to the Au tips leads to chain formation as can be seen in FIG. 8. Another example is the formation of ABAB chains where A represents one rod type and B another rod type. Here biochemical linkers such as avidin-biotin chemistry or DNA linking can be used to make selective ABAB chains. In another approach, combining tetrapods with rods on tip to tip basis may lead to formation of propeller structures.

The same chemistries can be used to self-assemble rods and tetrapods with Au tips onto patterned or non-patterned substrates. For example, a gold or silicon substrate is used together with a bifunctional ligand that binds with one function to the substrate and with the second function to the Au tip on the nanostructure.

Metal tipped structures also provide selective metal growth points for additional materials via a seeded growth solution-liquid-solid mechanism.

The invention claimed is:

1. A nanostructure having a branched shape with at least two elongated structure elements of a first material, wherein each of said elongated structure elements has an end portion, and wherein at least one of said end portions bears a nanozone of a second material that differs from said first material in at least one property selected from the group consisting of electrical conductivity, chemical reactivity and composition.

2. The nanostructure according to claim 1, wherein said second material is a metal or metal alloy.

3. The nanostructure according to claim 1, wherein said second material is a conductive polymer or an insulating material.

4. The nanostructure according to claim 1, wherein said second material is a semiconductor material.

5. The nanostructure according to claim 1, wherein said first and second materials are each a semiconductor material selected from the group consisting of Group II-VI semiconductors, Group III-V semiconductors, Group IV-VI semiconductors, Group IV semiconductors, alloys made of these semiconductors, combinations of the semiconductors in composite structures and core/shell structures of the above semiconductors.

6. The nanostructure according to claim 5, wherein said Group II-VI semiconductors are alloys selected from the group consisting of CdSe, CdS, CdTe, ZnSe, ZnS, ZnTe, and combinations thereof.

7. The nanostructure according to claim 1, wherein said first material is CdSe or CdSe/ZnS in a core/shell layered arrangement and said second material is gold.

8. A self assembled construct, comprising a plurality of nanostructures according to claim 1, wherein each nanostructure in the construct is linked to another nanostructure in the construct through the nanozones on the end portions of elongated structure elements thereof.

9. A solution comprising a plurality of nanostructures according to claim 1.

10. The nanostructure according to claim 1, wherein each of the end portions of said elongated structure is coupled to a nanozone.

11. The nanostructure according to claim 1, being selected from the group consisting of a tripod and a tetrapod.

12. The nanostructure according to claim 1, wherein said first material is selected from the group consisting of a semiconductor material, an insulating material, a metal and a combination thereof.

13. The nanostructure according to claim 1, in the shape of a branched bipod.

14. A method for forming a nanostructure having at least one elongated structure element of a first material, each said elongated structure element having an end portion, and a nanozone of a second material on the end portion of at least one of the elongated structure elements, said first and second materials being different in at least one property selected from the group consisting of electrical conductivity, chemical reactivity and composition, said method comprising:
- providing a solution of nanostructures consisting of a first material, each nanostructure having at least one elongated structure element having an end portion;
- contacting said nanostructures in solution with an agent of a second material, said agent being selected from the group consisting of a metal source, a metal alloy source, a conductive polymer source, an insulating material source and a semiconductor source; and
- allowing growth of said at least one agent of a second material on the end portion of at least one of the elongated structure elements of said nanostructures, to thereby obtain nanostructures bearing at least one nanozone on the end portion of at least one of the elongated structure elements.

15. The method according to claim 14, wherein said agent is selected from the group consisting of a metal source and a metal alloy source.

16. The method according to claim 14, wherein said first material is selected from the group consisting of a semiconductor material, an insulating material, a metal and a combination thereof.

17. The method according to claim 16, wherein said first material is a semiconductor material.

18. The method according to claim 17, wherein said nanostructure is selected from the group consisting of a bipod, a tripod and a tetrapod.

19. A method for forming an electrically conductive zone on a nanostructure having at least one elongated structure element, said method comprising:
- providing an organic solution of semiconductor nanostructures consisting of a first material, each nanostructure having at least one elongated structure element having an end portion;
- contacting said nanostructure in said organic solution with another organic solution comprising a metal or metal alloy source, a stabilizer and/or a surfactant and/or electron donor; and
- allowing growth of said metal or metal alloy on the end portion of at least one of the elongated structure elements of said semiconductor nanostructures, to thereby obtain semiconductor nanostructures, bearing at least one electrically conductive nanozone of metal or metal alloy on the end portion of at least one of the elongated structure elements.

20. The method according to claim 19, wherein said nanostructure is in a form selected from the group consisting of a nanorod, a bipod, a tripod, a tetrapod, a nanowire and a nanotube.

21. A nanostructure having at least one elongated structure element of a first material, wherein each of said elongated structure elements has an end portion, and wherein each of said end portion is coupled to a nanozone of a second material that differs from said first material in at least one property selected from the group consisting of electrical conductivity, chemical reactivity and composition, wherein at least one of the first and second materials is a semiconductor material, and wherein the second material is in direct contact with the first material.

22. The nanostructure according to claim 21, wherein said first material is a semiconductor material and said second material is a metal or metal alloy.

23. The nanostructure according to claim 21, wherein said second material is a semiconductor material.

24. The nanostructure according to claim 21, wherein said first and second materials are each a semiconductor material selected from the group consisting of Group II-VI semiconductors, Group III-V semiconductors, Group IV-VI semiconductors, Group IV semiconductors, alloys made of these semiconductors, combinations of the semiconductors in composite structures and core/shell structures of the above semiconductors.

25. The nanostructure according to claim 24, wherein said Group II-VI semiconductors are alloys selected from the group consisting of CdSe, CdS, CdTe, ZnSe, ZnS, ZnTe, and combinations thereof.

26. A self assembled construct, comprising a plurality of nanostructures according to claim 21, wherein each nanostructure in the construct is linked to another nanostructure in the construct through the nanozones on the end portions of elongated structure elements thereof.

27. A solution comprising a plurality of nanostructures according to claim 21.

28. The nanostructure according to claim 21, being selected from the group consisting of a bipod, a tripod and a tetrapod.

* * * * *